US007607543B2

(12) United States Patent
Gregerson et al.

(10) Patent No.: US 7,607,543 B2
(45) Date of Patent: Oct. 27, 2009

(54) RETICLE POD WITH ISOLATION SYSTEM

(75) Inventors: Barry Gregerson, Deephaven, MN (US); David Halbmaier, Shorewood, MN (US); Stephen Sumner, Minneapolis, MN (US); Brian Wiseman, Glencoe, MN (US); Anthony Mathius Tieben, Jordon, MN (US); Justin Strike, Maple Grove, MN (US)

(73) Assignee: Entegris, Inc., Chaska, MN (US)

( * ) Notice: Subject to any disclaimer, the term of this patent is extended or adjusted under 35 U.S.C. 154(b) by 250 days.

(21) Appl. No.: 11/364,562

(22) Filed: Feb. 26, 2006

(65) Prior Publication Data

US 2006/0260978 A1 Nov. 23, 2006

Related U.S. Application Data

(60) Provisional application No. 60/657,616, filed on Feb. 27, 2005, provisional application No. 60/657,355, filed on Feb. 27, 2005, provisional application No. 60/774,834, filed on Feb. 18, 2006.

(51) Int. Cl.
*B65D 85/00* (2006.01)

(52) U.S. Cl. .......................... 206/710; 355/72; 355/75; 414/217.1

(58) Field of Classification Search ................ 206/710; 355/53, 72, 75; 414/217.1
See application file for complete search history.

(56) References Cited

U.S. PATENT DOCUMENTS

| 3,615,006 | A | * | 10/1971 | Freed ........................ 206/454 |
| 4,443,098 | A | * | 4/1984 | Walwyn et al. ............... 355/74 |
| 4,776,462 | A | | 10/1988 | Kosugi et al. |
| 5,296,893 | A | | 3/1994 | Shaw et al. |
| 5,314,068 | A | * | 5/1994 | Nakazato et al. ............ 206/454 |
| 5,353,934 | A | * | 10/1994 | Yamauchi ................... 206/454 |
| 5,725,100 | A | * | 3/1998 | Yamada ...................... 206/710 |
| 5,957,292 | A | * | 9/1999 | Mikkelsen et al. .......... 206/710 |
| 5,971,191 | A | * | 10/1999 | Yamada et al. .............. 220/378 |
| 6,216,873 | B1 | | 4/2001 | Fosnight et al. |
| 6,239,863 | B1 | | 5/2001 | Catey et al. |
| 6,338,409 | B1 | | 1/2002 | Neary |
| 6,496,248 | B2 | * | 12/2002 | Tanaka ........................ 355/72 |
| 6,550,619 | B2 | | 4/2003 | Bores et al. |
| 6,825,916 | B2 | | 11/2004 | Wiseman et al. |
| 6,848,578 | B2 | * | 2/2005 | Eggum ....................... 206/454 |
| 6,862,817 | B1 | | 3/2005 | Lenox |

(Continued)

FOREIGN PATENT DOCUMENTS

EP 0522865 A2 7/1992

(Continued)

*Primary Examiner*—Diane I Lee
*Assistant Examiner*—Steven H Whitesell-Gordon
(74) *Attorney, Agent, or Firm*—Patterson, Thuente, Skaar & Christensen, P.A.

(57) ABSTRACT

The present invention provides a reticle container that is equipped with a secondary container which houses the reticle and is housed in the primary container. The secondary container is held within the primary container with shock and vibration isolation members so that the secondary container has multiple degrees of freedom of motion within the primary container. The reticle is secured inside the secondary container such that shock and vibration transmission from the reticle container to the reticle is substantially attenuated.

20 Claims, 13 Drawing Sheets

U.S. PATENT DOCUMENTS

| | | |
|---|---|---|
| 6,906,783 B2 | 6/2005 | del Puerto et al. |
| 6,960,772 B1 | 11/2005 | Johnson et al. |
| 2001/0010292 A1 | 8/2001 | Shirasaki |
| 2002/0066692 A1 | 6/2002 | Smith et al. |
| 2003/0010657 A1* | 1/2003 | Zabka et al. ............... 206/303 |
| 2003/0218728 A1 | 11/2003 | del Puerto et al. |
| 2003/0227605 A1* | 12/2003 | del Puerto et al. ........... 355/51 |
| 2004/0005209 A1 | 1/2004 | Su et al. |
| 2005/0230398 A1* | 10/2005 | Hasegawa et al. .......... 220/323 |

FOREIGN PATENT DOCUMENTS

| | | | |
|---|---|---|---|
| EP | 1341045 | A1 | 2/2003 |
| EP | 1341 042 | A3 | 3/2004 |
| EP | 1434094 | A1 | 6/2004 |
| JP | 61130127 | A | 6/1986 |
| JP | 62076531 | A | 4/1987 |
| JP | 63198061 | A | 8/1988 |
| JP | 63198062 | A | 8/1988 |
| JP | 3083792 | | 4/1991 |
| JP | 07297272 | A | 11/1995 |
| JP | 092118502 | A | 8/1997 |
| JP | 09255078 | A | 9/1997 |
| JP | 2004071729 | A | 3/2004 |
| WO | WO 02/04311 | A1 | 7/2001 |

* cited by examiner

RETICLE POD WITH ISOLATION SYSTEM

RELATED APPLICATIONS

The present application claims the benefit of U.S. Provisional Application Ser. No. 60/657,616, filed Feb. 27, 2005, U.S. Provisional Application Ser. No. 60/657,355, filed Feb. 27, 2005, and U.S. Provisional Application Ser. No. 60/774,834, filed Feb. 18, 2006, which are included herein in their entirety by reference.

FIELD OF THE INVENTION

The invention relates to substrate carriers and in particular to processor carriers and shippers and in particular to reticle containers.

BACKGROUND OF THE INVENTION

Photolithography is one of the process steps commonly encountered in the processing of silicon wafers for semiconductor applications. In photolithography, a wafer surface with a deposit of silicon nitride is coated over with a light-sensitive liquid polymer or photoresist and then selectively exposed to a source of radiation using a template with a desired pattern. Typically, ultraviolet light is shone through or reflected off a surface of a mask or reticle to project the desired pattern onto the photoresist covered wafer. The portion of the photoresist exposed to the light is chemically modified and remains unaffected when the wafer is subsequently subjected to a chemical media that removes the unexposed photoresist leaving the modified photoresist on the wafer in the exact shape of the pattern on the mask. Typically, the wafer is subjected to an etch process that removes the exposed portion of the nitride layer leaving a nitride pattern on the wafer in the exact design of the mask.

The industry trend is towards the production of chips that are smaller and/or with a higher logic density necessitating smaller and smaller line widths on larger wafers. Clearly, the degree of fineness to which the surface of the reticle can be patterned, and the degree to which this pattern can be faithfully replicated onto the wafer surface, are factors that impact the quality of the ultimate semiconductor product. The resolution with which the pattern can be reproduced on the wafer surface depends on the wavelength of ultraviolet light used to project the pattern onto the surface of the photoresist-coated wafer. State-of-the-art photolithography tools use deep ultraviolet light with wavelengths of 193 nm, which allow minimum feature sizes on the order of 100 nm. Tools currently being developed use 157 nm Extreme Ultraviolet (EUV) light to permit resolution of features at sizes below 70 nm.

The reticle is a very flat glass plate that contains the patterns to be reproduced on the wafer. Typical reticle substrate material is quartz. Because of the tiny size of the critical elements of modern integrated circuits, it is essential that the operative surface of the reticle (i.e. the patterned surface) be kept free of contaminants that could either damage the surface or distort the image projected onto the photoresist layer during processing thereby leading to a final product of unacceptable quality. Typically, the critical particle sizes are 0.1 µm and 0.03 µm for the non-patterned and patterned surfaces respectively when EUV is part of the photolithography process. Typically, the patterned surface of the reticle is coated with a thin, optically transparent film, typically of nitrocellulose, attached to and supported by a frame, and attached to the reticle. Its purpose is to seal out contaminants and reduce printed defects potentially caused by such contaminants migrating to the image plane. However, extreme EUV utilizes reflection from the patterned surface as opposed to transmission through the reticle characteristic of deep ultraviolet light photolithography. Currently, the art does not provide pellicle materials that are transparent to EUV. Consequently, the reflective photomask (reticle) employed in EUV photolithography is susceptible to contamination and damage to a far greater degree than reticles used in conventional photolithography. This situation imposes heightened functional requirements on any container designed to receive, store, transport and ship a reticle destined for EUV photolithography use.

Clearly, unnecessary and unintended contact with other surfaces during manufacturing, processing, shipping, handling, transport or storage is highly undesirable in view of the susceptibility of the delicate features on the patterned surface of the reticle to damage due to sliding friction and abrasion. Secondly, any particulate contamination of the surface of the reticle will likely compromise the reticle to a degree sufficient to seriously affect any end product obtained from the use of such a reticle during processing. Particles can be generated within the controlled environment containing the reticle during processing, transport and shipping. Sliding friction and consequent abrasion is one source of contaminating particulates. A reticle sliding from its desired position in a reticle container during transport, for example, is another source of particulates. Such an out-of-position reticle will also likely be misaligned when automatically retrieved from the container and positioned into processing equipment potentially leading to an end product that is of unpredictable quality. Sliding contact during placement and removal of a reticle from the container to the lithography equipment also creates opportunities for particulate generation and contamination. Finally, shock and vibration of the container can be transmitted to the reticle and components holding the reticle causing friction and associated particle generation.

Conventionally, reticles are shipped to the fabrication facility in which they are used in one container and are stored in the fabrication facility inbetween uses in other containers. The shipping containing is typically discarded after use. The transfer of the reticles from the shipping containers to the containers in which they are stored within the fabrication facility creates another opportunity for contamination. Conventional requirements for shippers for reticles and containers for use within the fabrication facility are dramatically different. Combining the container for both uses would eliminate the opportunity of incursion and generation of particulates during the transfer from the shipper container to the fabrication facility use container but presents significant design challenges. For example the container would need to be able to handle the potential dramatic changes in atmospheric pressure during transportation, such as associated with altitude and temperature changes. Also shock absorption capabilities in transportation are much more demanding than in the controlled robotic transfers occurring in fabrication facilities.

Some of the considerations discussed above are also applicable to semiconductor wafer substrates. Recognizing the need for a controlled environment around the wafer, especially during storage, processing and transport, prior art has evolved approaches to isolation technology that allows for control of the environment in the immediate vicinity of a wafer by providing for a container to house the wafer so that it can be kept relatively free from incursion of particulate matter.

Wafers are typically shipped to a fabrication facility in a shipping container and then transferred to a separate container for storing the wafers in between processing steps in the fabrication facility. 200 mm wafers are typically shipped in sealed plastic "shippers" either edge supported in a spaced array or stacked vertically with sheet material spacers in "coin stack wafer shippers" Industry standardized containers for holding 200 mm wafers in between processing steps in fabrication facilities are known as standard mechanical interface pods, or SMIF pods and having bottom opening doors. For 300 mm wafers, the shippers are known as front opening shipping boxes, or FOSBS, and the containers for holding the wafer in between process steps are known as front opening unified pods, or FOUPS. Reticles stored in Fabrication facilities in between fabrication steps now often are stored in bottom opening containers similar to the standardized SMIF pods and are termed reticle SMIP pods, or RSPs.

Even when substrates, that is wafers and reticles, are in such a controlled environments, particulates that may be present inside the controlled environment can migrate due to pressure changes of the air trapped in the controlled environment or turbulence of the trapped air brought on by rapid movements of the container and/or by disturbing the trapped air volume, such as by simply opening and closing the container. Also, thin walled shippers or FOSBS may experience wall movement due to altitude related pressure changes causing the trapped air inside the controlled environment to be displaced. Temperature changes can set up convection currents within the container. Dimensional changes of the container and its components can compromise the functioning of the support and retaining mechanisms leading to wafer misalignment and/or warping of the substrate carried within the container. Dimensional changes of the container wall due to pressure fluctuations can compromise the sealing between the cover and the door of the carrier allowing particulate incursion within the carrier.

Prior art approaches, particularly in wafer containers, utilize a breathing apparatus between the external environment and the internal controlled volume of air. The breathing apparatus provides a path for the air to flow. A filter interposed in the path is expected to provide a barrier to incursion of particulates from the external environment into the controlled environment of the carrier. However, as noted above, the reticle used in a EUV photolithography process has very fine and delicate features so the critical particle sizes are only of the order of 0.1 µm and 0.03 µm for the non-patterned and patterned surfaces of the reticle respectively. At such low particle sizes, a filter would require a very fine pore size causing a considerable resistance to fluid flow across it thereby necessitating a larger filter surface area. The alternative to a larger filter surface area is a slower response to sudden pressure changes such as those encountered in shipping the container. Both of these are not desirable alternatives because one of the objectives of reticle SMIF pod design is to keep the controlled volume to a minimal so it can be effectively sealed against incursion of particulates. Minimizing the controlled volume within which the reticle is positioned whilst providing for a large filter area to achieve pressure equalization within the controlled volume are incompatible objectives.

It is desirable that particulates that are generated or are otherwise introduced or present within the controlled environment are prevented from settling on the reticle. In this regard, it is preferable to have a minimal volume for the environment within which the reticle is carried and which has to be controlled to avoid particulate contamination. It is also desirable that the air in the controlled volume remains relatively static. For example, the deflection of a wall of the container in response to large and sudden pressure differences can induce a pressure wave inside the container.

Reticles come in various sizes, including a 5", 6", 7", 8", 150 mm and 200 mm diameter reticle. However, the SMIF pod door is equipped with features in compliance with currently implemented "SMIF" (Standard Mechanical Interface) pod standards so that the SMIF pod door can be interfaced with automatic reticle handling processing machinery. As the reticle sizes continue to evolve, it becomes increasingly challenging to support a reduced diameter reticle with minimal volume for the environment within which the reticle is carried if the SMIF pod is a legacy SMIF pod designed for an earlier generation, larger sized reticle. In this respect it would be advantageous to be able to use a legacy SMIF pod but support a reduced diameter reticle that the pod was not originally designed for.

What is needed is a substrate container suitable for use both as a shipper and to store the substrates in between processing steps in the fabrication facilities. What is needed is a container that provides improved shock absorption capabilities during transportation. What is needed is a container that provides improved resistance to particulate generation and minimization of particle disruption or movement within a substrate container during transportation, and opening and closing of the container.

SUMMARY OF THE INVENTION

The present invention is directed to an apparatus for supporting a substrate to provide shock and vibration isolation, the apparatus comprises an outer primary pod, comprising a cover and a base preferably configured as a bottom opening door, and a secondary pod supported therein by resilient shock and vibration isolation members. Cover and base of the primary pod are configured to be mated to provide a hermetically sealed first enclosure The secondary pod is desirably supported exclusively by elastomeric members extending both from the cover and the base. In preferred embodiments the secondary pod has multiple degress of freedom of motion, preferably six, with respect to the primary pod and moves with the reticle contained therein in isolation from the outer primary pod. The actual motion allowed may be minimal, but is sufficient for absorbing a portion of the energy from shocks imparted to the primary pod. The secondary pod is configured with a lower portion configured as a tray having a reticle support structure, preferably corner posts having lateral restraints and a elastomeric pad upon which the reticle seats. An upper portion of the tray engages with the lower portion to define the secondary enclosure and also preferably has elastomeric pads to engage the top surface of the reticle. The upper and lower portion may provide a hermetic seal such as by an elastomeric member or other sealing means such as hard planar surface to hard planar surface contact or may have a restricted opening, an elongate gap extending substantially around the periphery of the secondary pod to minimize pressure shock waves and inhibit particles without a hermetic seal.

Additionally, the cover of the primary pod may be supported by elastomeric seal to provide shock absorption with respect to the top cover and the base. In a preferred embodiment the elastomeric seal may have two cantilevered portions and a central spanning portion and be positioned within groove in upwardly facing surface of the base for engagement with downwardly extending ribs integral with the top cover.

The inner secondary pod can be replaced utilizing the same essential configuration of the primary pod with a upper portion and lower portion configured to secure a different size reticle therein.

It is a feature and advantage of preferred embodiments of the invention to provide enhanced shock and vibration isolation to the reticle.

It is a feature and advantage of preferred embodiments of the invention to provide enhanced shock and vibration absorption before such shock and vibration reaches the reticle contained therein.

It is a feature and advantage of preferred embodiments of the invention to provide a dual containment to the reticle with is particularly advantageous for utilizing the pod as both a shipping device and a device for storing the reticle within the fabrication facility particularly intermediate processing steps.

It is a feature and advantage of preferred embodiments of the invention to provide a reticle SMIF pod that may be used to transport and store different sizes of reticles using a common size, namely 200 mm.

It is a feature and advantage of preferred embodiments of the invention to provide a reticle SMIF pod that is particularly suitable for use with EUV lithography techniques.

DETAILED DESCRIPTION OF THE INVENTION

References to relative terms such as upper and lower, front and back, left and right, or the like, are intended for convenience of description and are not contemplated to limit the present invention, or its components, to any one positional or special orientation. All dimensions depicted in the figures may vary with a potential design and the intended use of a specific embodiment of this invention without departing from the scope thereof.

Each of the additional figures and methods disclosed herein may be used separately, or in conjunction with other features and methods, to provide improved containers and methods for making and using the same. Therefore, combinations of features and methods disclosed herein may not be necessary to practice the invention in its broadest sense and are instead disclosed merely to particularly describe representative and preferred embodiments of the instant invention.

Figure 1:
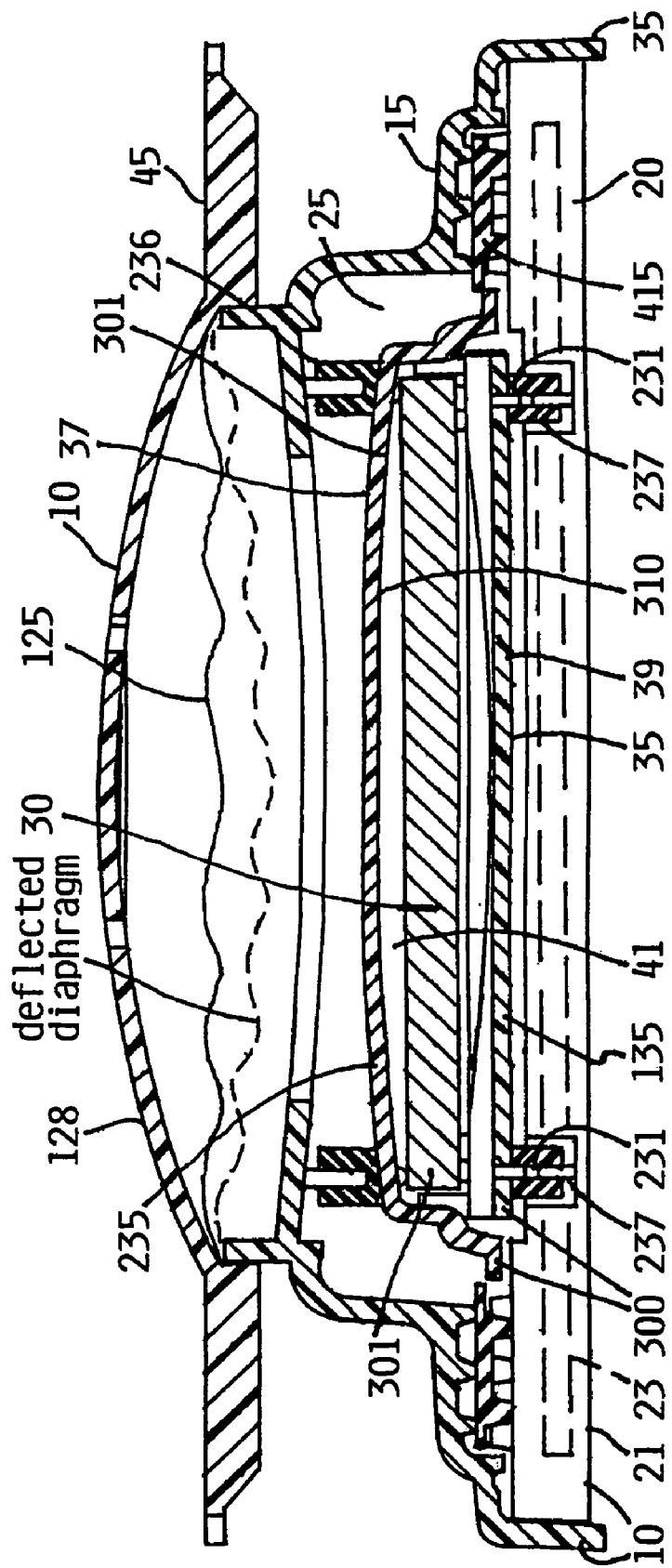
FIG. 1 is a cross-sectional elevational view of an assembled container according to one embodiment of the present invention.

Referring now to FIG. 1, there is illustrated a reticle container 10 (alternatively identified as a reticle "pod" or reticle "carrier" or "primary pod") according to a primary embodiment of the present invention. The reticle container 10 generally includes a cover 15 capable of sealingly mating with a base 20 (alternatively identified as a door) to define a hermetically sealed enclosure 25 within the container 10 for containing a reticle 30 during storage, transport, processing and shipping. Reticle 30 thus located within sealed enclosure 25 is effectively isolated from particulate contaminants external to the enclosure 25. As best explained with reference to FIG. 3, the container 10 generally includes a reticle support structure 32 and a reticle retaining structure 34 mounted on the base 20 and on the cover 15 respectively within the sealed enclosure 25. The reticle 30 is located and supported on the reticle support structure 32 mounted to the base 20. Upon engaging the cover 15 with the base 20, the reticle retaining structure 34 mounted on the cover 15 operates to secure the reticle 30 on the reticle support structure 32 as best seen in the illustration of FIG. 1. Reticle support structure 32 defines a lower portion 35 and reticle retaining structure 34 defines an upper portion 37 of secondary pod 39 having an interior 41.

Figure 2:
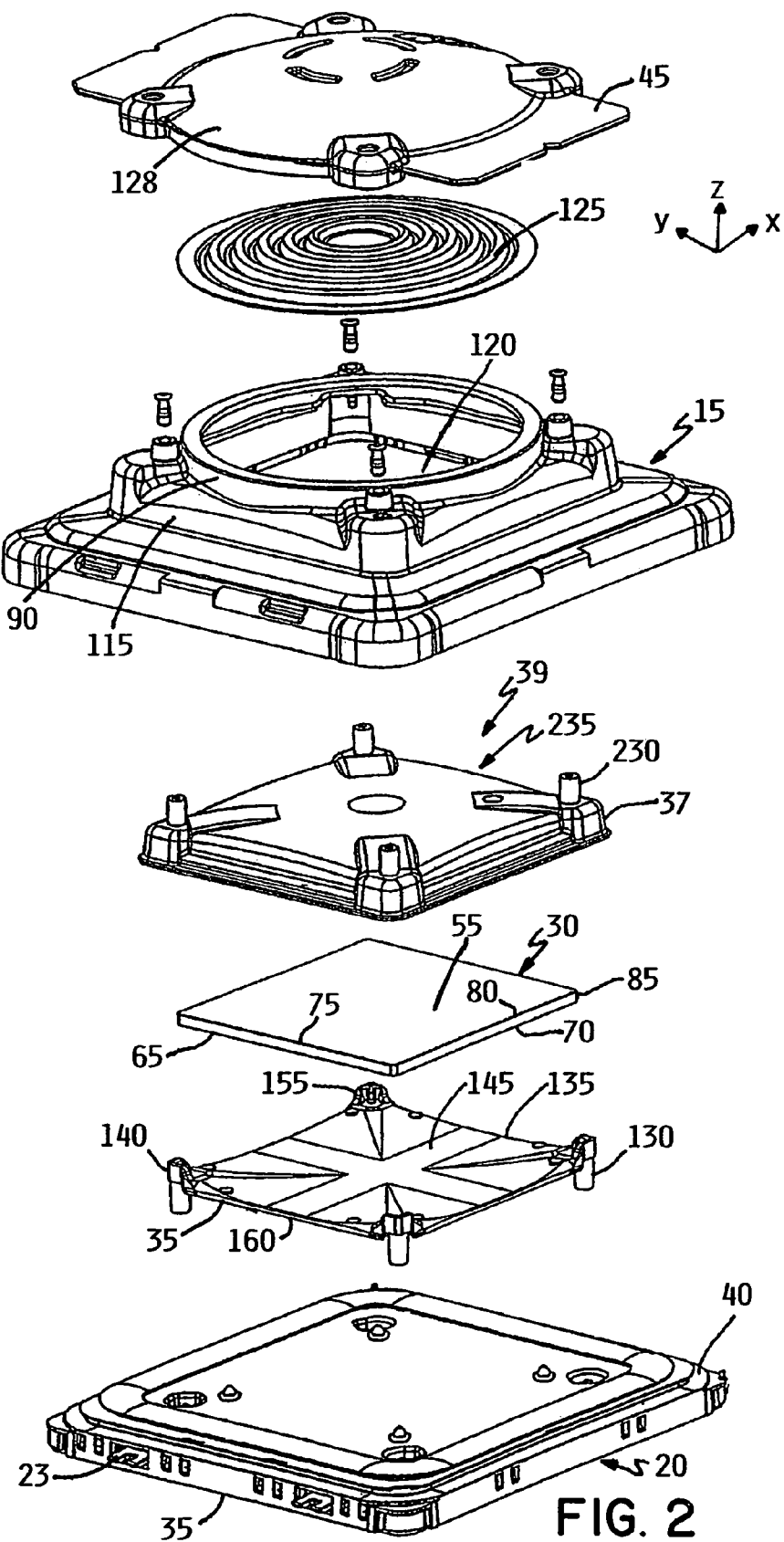
FIG. 2 is an exploded perspective view of an assembly of the container according to an exemplary embodiment of the present invention.
Figure 3:
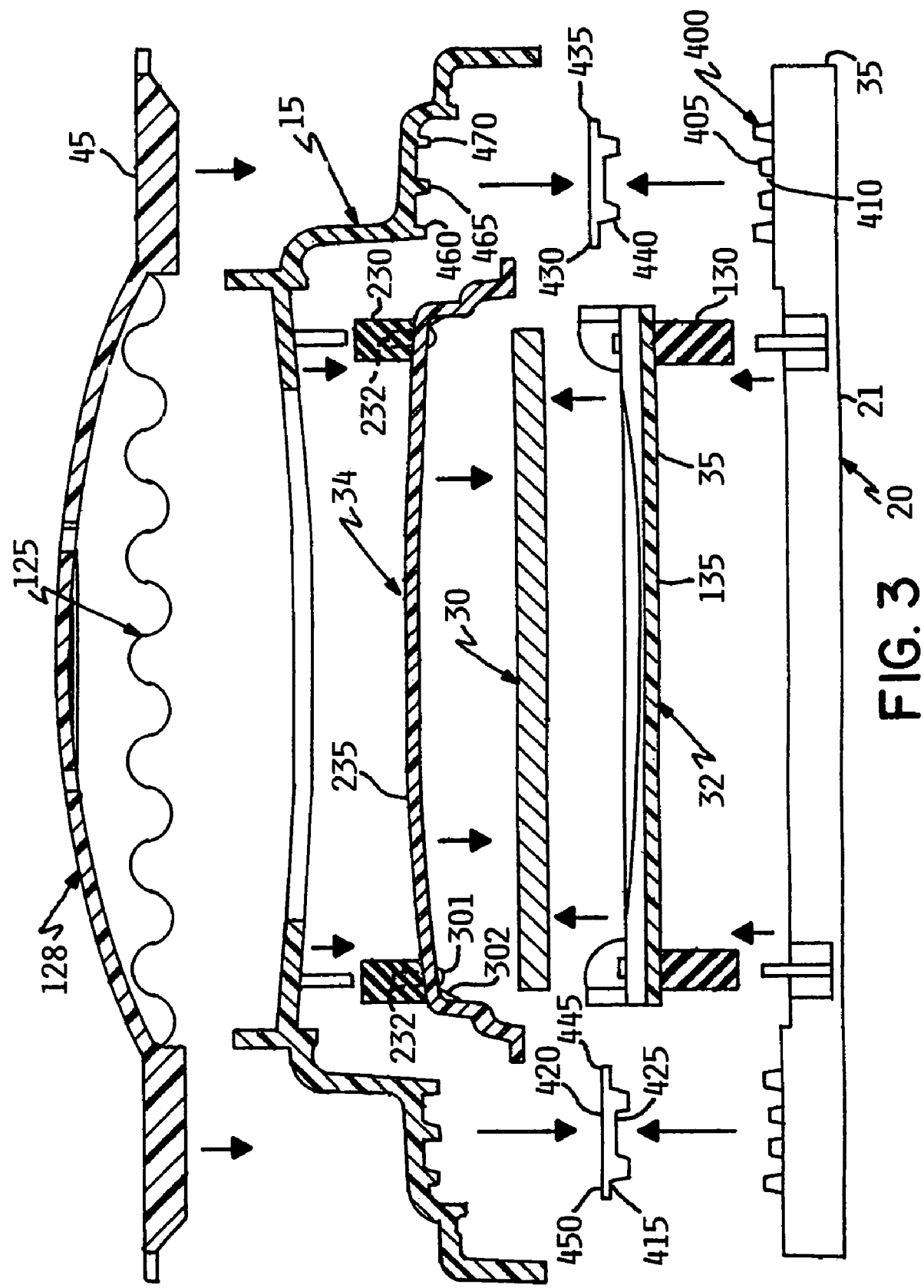
FIG. 3 is an exploded cross-sectional elevational view of an assembly of the container including the components of the isolation system according to the primary embodiment of the present invention.

Referring now to FIGS. 1, 2 and 3, the base 20 is provided with features to comply with Semiconductor Equipment and Materials International (SEMI) standards for automated use with various types of wafer-fabrication equipment. In an exemplary embodiment, the base 20 is at least partially compliant with similar bases on Reticle "SMIF" (Standard Mechanical Interface) pods used with microlithography systems well-known in the art. In the exemplary embodiment illustrated in FIGS. 2 and 5, the base 20 has a base lower-surface 21 bounded by a base peripheral edge 35 and having footprint of area (not illustrated) opposite a base upper-surface 40 spaced from the lower surface by a base lateral surface 42 comprising the door enclosure wall. The base lower surface is provided with features in accordance with SMIF standards so as to be compatible with semiconductor processing equipment (not shown). The SMIF compliant base 20 is also adapted to be removably coupled to the cover 15 by means of a door-latch mechanism 23 capable of being opened by a SEMI conformable latch opening device (not illustrated). An exemplary latching-mechanism is disclosed in U.S. Pat. No. 4,995,430 owned by the owner of the instant application and incorporated herein by reference. The cover 15 is generally equipped with an automation flange 45 configured for interfacing with a process tool (not illustrated) as well as for manual grasping during transport, storage or shipping of the container 10. In the illustrated embodiments of FIGS. 1, 2 and 3 the cover 15 and the base 20 are shown to be generally rectangular to conform to the shape of the reticle 30. However, one of skill in the art will readily recognize that the cover and the base could have other shapes without departing from the scope of the present invention.

Container elements, exemplified, for example, by the cover 15 and the base 20, are preferably formed of a rigid thermoplastic polymers, by a process of injection molding or other suitable manufacturing process. The polymer can be clear to allow the viewing of the reticle 30. The container elements may additionally be static dissipative. An example of such a transparent, static dissipative material, is polymethyl methacrylate. The container elements may alternatively be formed of static dissipative, carbon fiber-filled polycarbonate, which is opaque, and configured to include transparent window(s) (not illustrated), through which the reticle may be viewed. As a further alternative, the container elements may be formed of clear polycarbonate. As an alternative to polycarbonate, the elements may further be formed of flame retardant polyetherimide. It is understood that the container elements may be formed of other materials in alternative embodiments. The container elements are preferably formed by injection molding, but other known methods of manufacture are also contemplated. An exemplary reticle SMIF pod is described in U.S. Pat. No. 6,216,873 to Asyst Technologies Inc., the contents of which are incorporated herein by reference. Use of reticle pods in EUV applications is described in detail in U.S. Pat. No. 6,906,783, which is incorporated herein by reference.

FIG. 2 depicts an exemplary reticle 30 according to the present invention. As seen in FIG. 2 the reticle 30 is generally square shaped with a first patterned surface 50 opposite a second chucking surface 55 and spaced apart by a lateral surface 60. The first patterned surface 50 intersects the lateral surface 60 at first and second lower pair of parallel edges 65 and 70 respectively. The second chucking surface 55 intersects lateral surface 60 at first and second upper pair of parallel edges 75 and 80 respectively. In a typical rectangular shaped reticle illustrated in FIG. 2, first and second lower pair of edges 65 and 70 are parallel to respective first and second upper pair of edges 75 and 80, each corresponding pair of parallel edges of a surface blends with the other corresponding pair of parallel edges at radiused corners 85. The patterned surface 50 is etched with the desired circuit pattern (not illustrated). The chucking surface 55 may be used as a reference surface during the manufacture and handling of the reticle. For example, the chucking surface 55 may be held in an electrostatic chuck. The very fine features on the patterned surface 55 can be easily damaged upon contact with other surfaces, such as the surfaces of the container 10. To avoid such contact, the reticle 30 is generally supported at peripheral portions of the reticle surfaces 50 and 55 that are proximate the radiused corners 85 because these portions are typically pattern free. Likewise, the reticle 30 may also be contacted along its edges without damaging it. But contacting surfaces must be restrained against motion relative to each other because of the potential for generating particulates by abrasion of the contacting surfaces. Positional locators and other structural features may be incorporated on the cover 15 to allow for mating the cover and door without having to adjust for misalignment between cover and door thereby reducing reticle sliding friction. The present invention is described with reference to a square shaped reticle but one of skill in the art will appreciate that reticles of all shapes are within the scope of the present invention including. Reticles may be, but are not limited to, polygonal or rectangular in shape.

Figure 4:
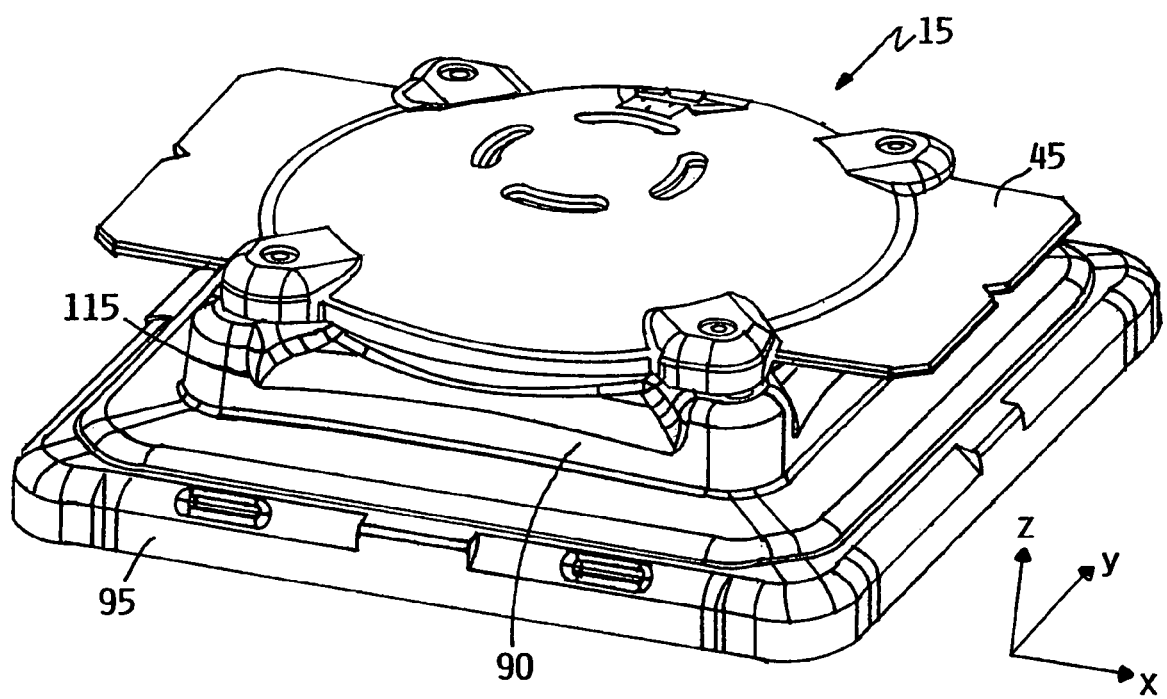
FIG. 4 is a perspective view of a cover according to a primary embodiment of the present invention.
Figure 5:
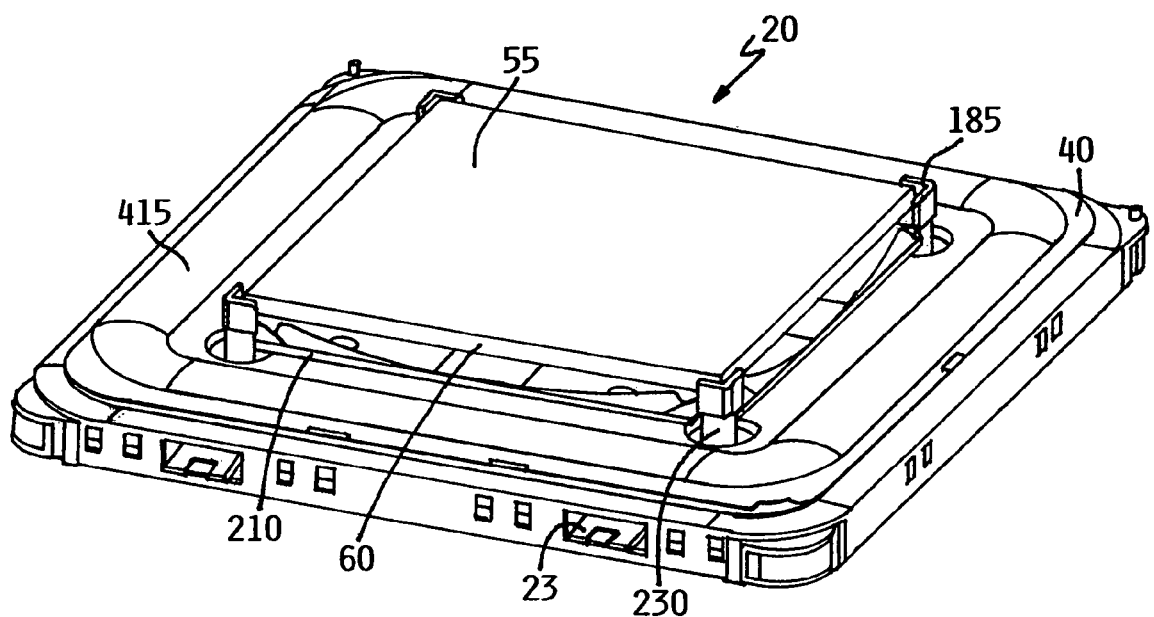
FIG. 5 is a perspective view of a base and a substrate supported on the base according to the primary embodiment of the present invention.
Figure 6:
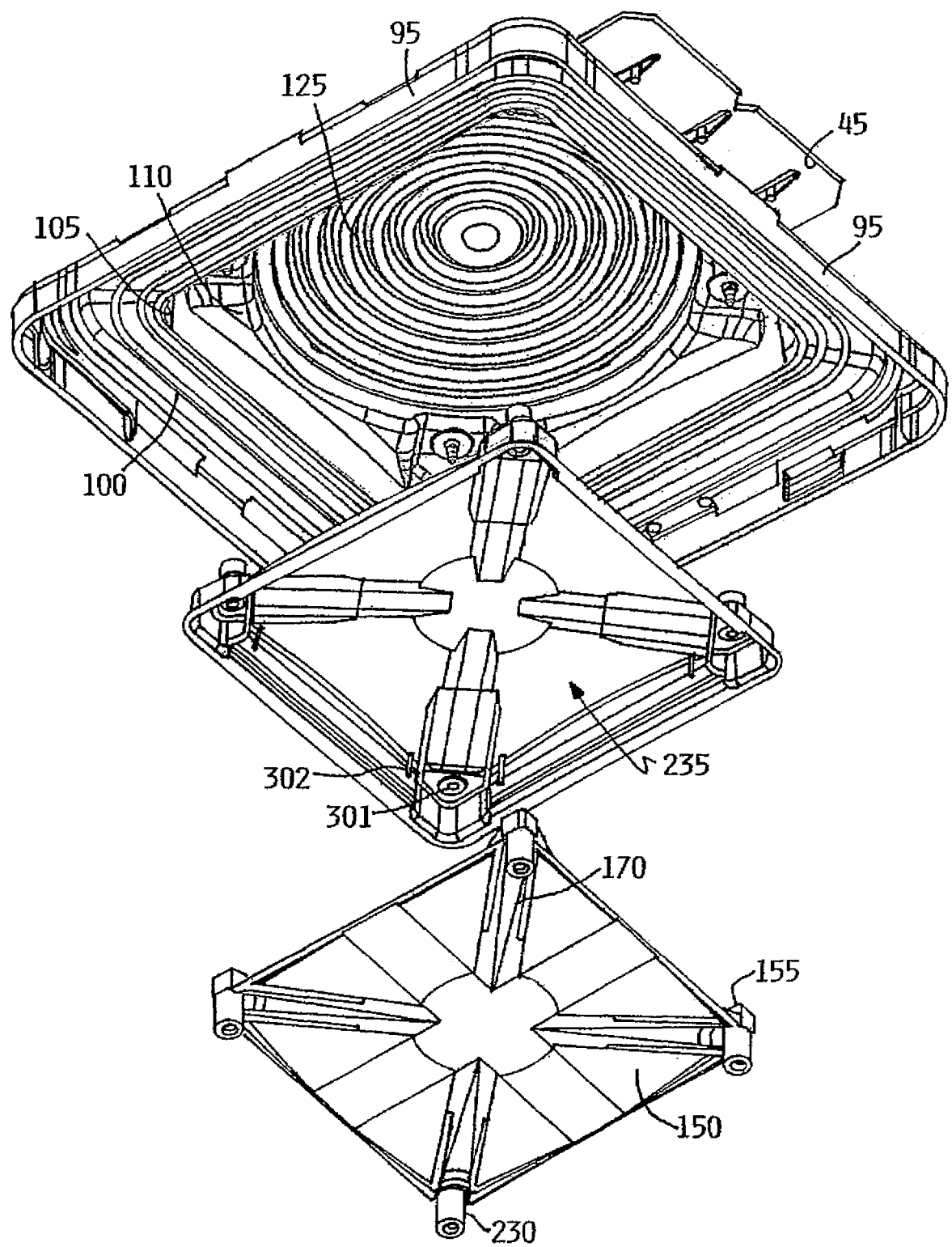
FIG. 6 is a perspective view looking upward of the cover and components of a secondary pod according to an exemplary embodiment of the present invention.

As best seen in the illustrations of FIGS. 4 and 6, the cover 15 includes a canopy 90, cover side walls 95 and cover engagement surface 100. Canopy 90 comprises a canopy peripheral edge 105, a canopy concave inner surface 110 opposite a canopy exterior surface 115. Cover engagement surface 100 extends between and is located circumjacent canopy peripheral edge 105 and cover side walls 95. Upon engaging cover 15 with base 20, base upper surface 40 is positioned facing cover engagement surface 100 with the cover side walls 95 located circumjacent base lateral surface 42 so that the base 100 is substantially disposed within canopy 90. In this configuration, canopy concave inner surface 110 in conjunction with base upper surface 40 together form sealed enclosure 25 as will be detailed below. In the exemplary embodiment illustrated in FIGS. 4 and 6, canopy 90 further comprises a structure defining a vent 120. The vent 120 serves to communicate the sealed enclosure 25 within the container 10 to the ambient atmosphere exterior to the container 10 when cover 15 is mated with base 20. A flexible diaphragm 125, shown in FIG. 5, is sealingly attached to canopy 90 and configured to extend over vent 115 to prevent sealed enclosure 25 from communicating with the ambient atmosphere through the vent 115. A change in pressure, without or within the sealed enclosure 25 is desirably equilibriated by a movement of the diaphragm. The automation flange 45 is attached to the canopy 90 on the exterior surface 115 and is configured with an apertured dome shaped portion 128 that extends over the diaphragm 125 so as to shield the diaphragm 125 from external contact while allowing exposure to the ambient atmosphere.

Figure 10A:
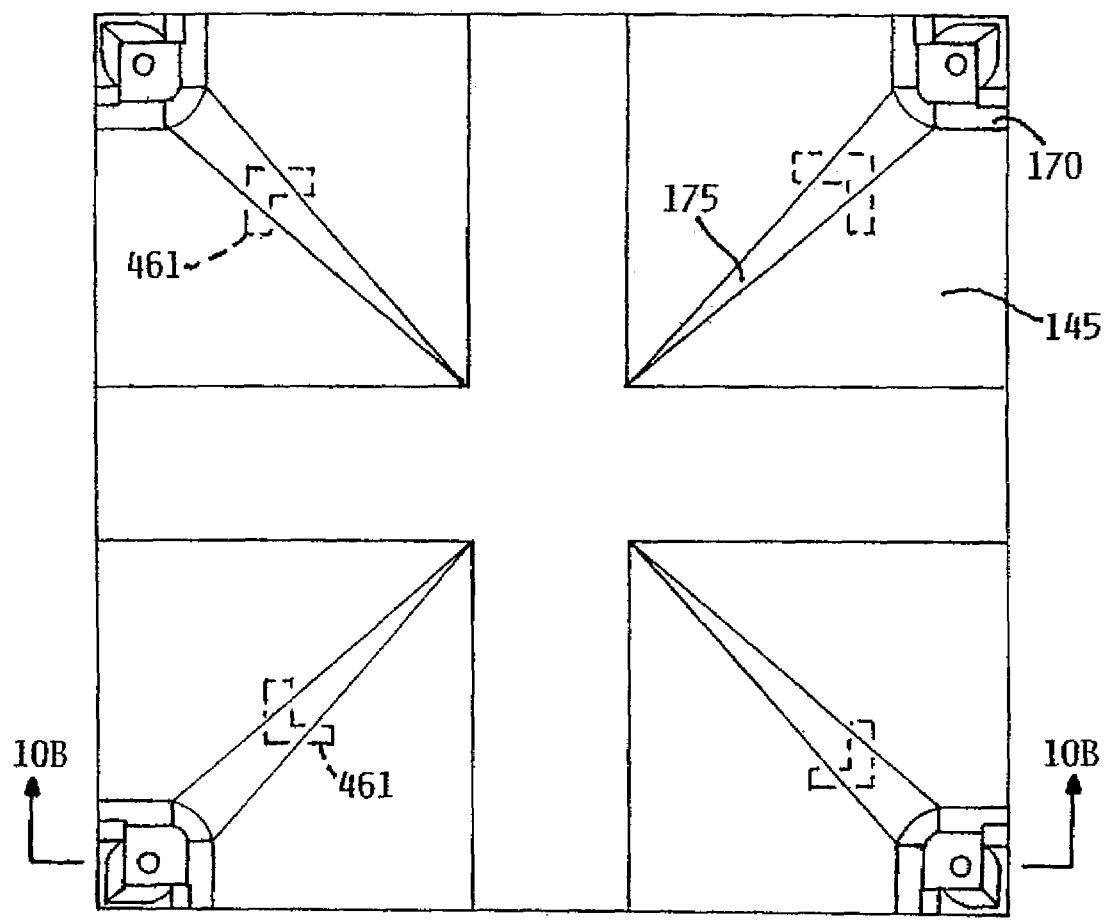
FIG. 10A is a top view of the lower portion (or tray) according to an exemplary embodiment of the present invention.
Figure 10B:
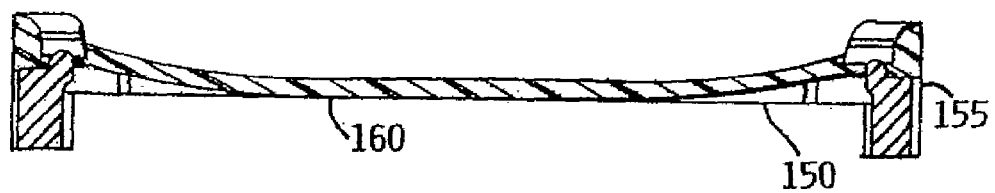
FIG. 10B is a side sectional view of the lower portion (or tray) of FIG. 10A.
Figure 10C:
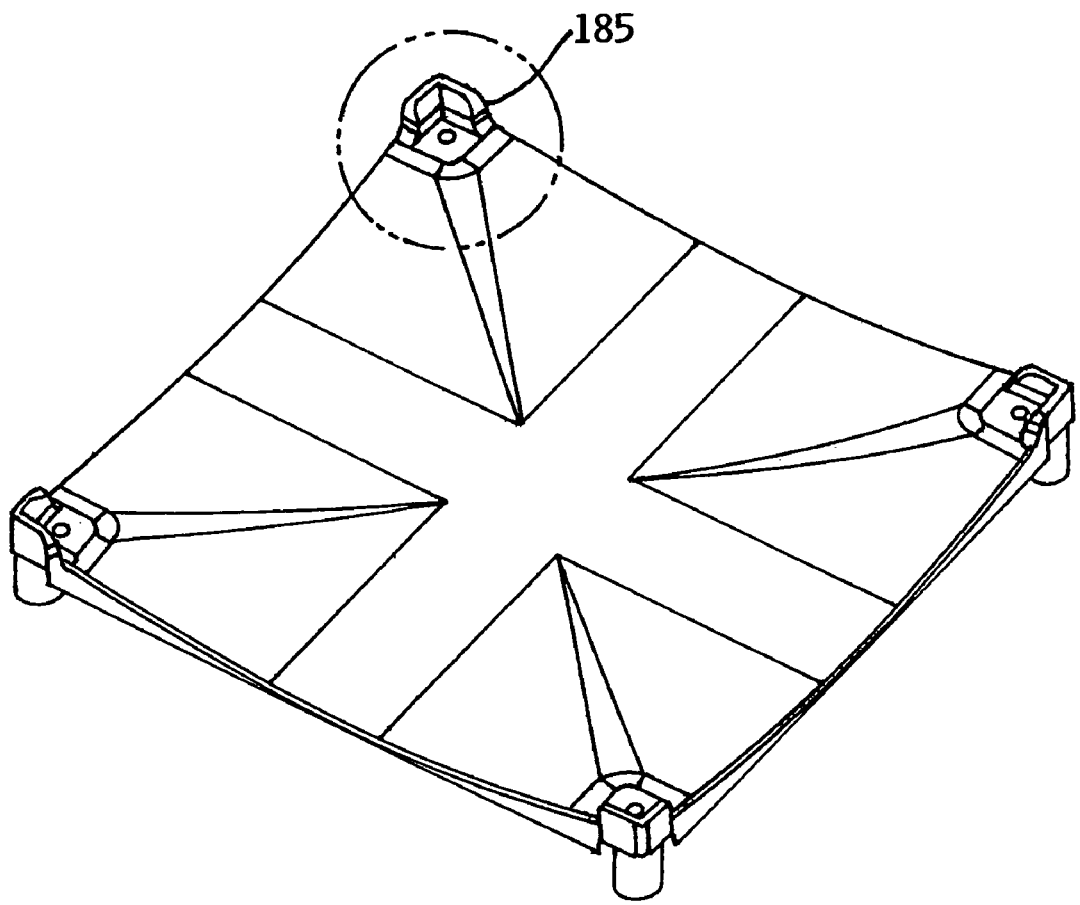
FIG. 10C is a top perspective view of the lower portion (or tray) according to an exemplary embodiment of the present invention.
Figure 10D:
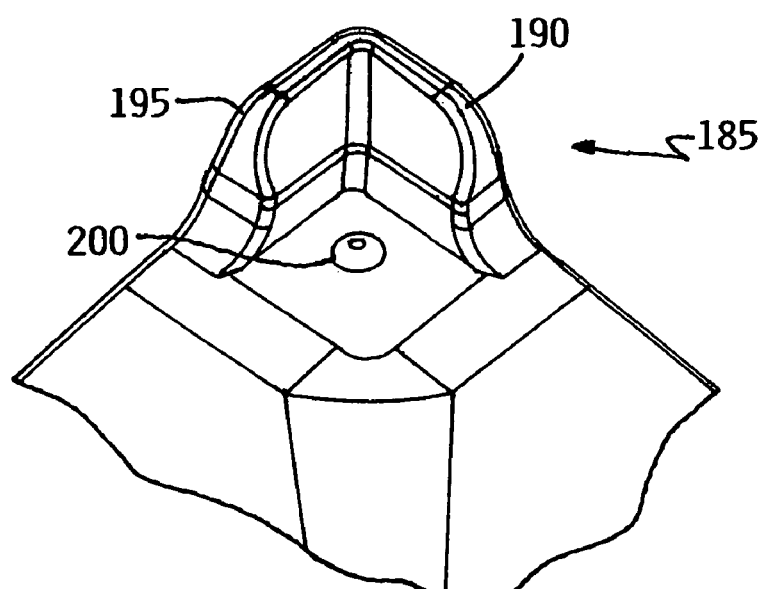
FIG. 10D is a detailed view of a support structure for holding the substrate on the lower portion (or tray) illustrated in FIG. 10A-10D.

In the primary embodiment illustrated in FIGS. 2, 5, 10A, 10B, 10C and 10D, the reticle support structure comprises a plurality of resilient couplings preferably formed of elastomeric material, preferably a thermoplastic elastomer, configured as reticle support posts 130 and a reticle support frame 135 (alternatively identified as a lower tray or lower portion of a secondary pod). Alternative cushioning material may be utilized. Reticle support posts 130 are mounted to or formed on base 20 and configured to extend outwardly from the upper surface 40 to terminate at support post ends. An exemplary embodiment of the reticle support frame 135 comprises a substantially square plate with a support frame upper surface 145 and opposed support frame lower surface 150 extending between support frame corners 155 and support frame edges 160. Support frame upper surface 145 is spaced apart from support frame lower surface 150 by support frame variable thickness 165 so that support frame plate edges 160 present an arcuately profiled cross-section as shown in FIG. 10B. Each of the support frame corners 155 is provided with a first support frame gusset 170 formed on the support frame lower surface 150 with the first support frame gussets 170 extending inwardly toward an support frame opposite corner 155 and inwardly toward an opposite support frame corner respectively. Reticle support posts 130 are attachable at support post ends 140 to support frame lower surface 150 proximate each of the corners 155. Each support frame corner 155, opposite the point of attachment of resilient support posts 130, is provided with a reticle support pad 175 extending outward from the support frame upper surface 145 to present a beveled concavity 185 removed from the support frame upper surface 145. Beveled concavity 185 includes a pair of beveled concavity sidewalls 190 and 195 which are sloped generally downward the reticle support plate 135 and which form right angles with each other in a plane normal to lateral surface 60 of the reticle 30. Included in between the two beveled concavity sidewalls 190 and 195 and substantially equidistant from them is a dome shaped protrusion 200 extending from first support frame upper surface 145 proximate support frame corners 155. The sloping sidewalls 190 and 195 of each beveled concavity 185 support the reticle 30 by contacting the reticle 30 at first and second lower pair of parallel edges 65 and 70 proximate radiused corners 85. The reticle 30 contacts the dome shaped protrusion 200 over a minimal contact area thereby effectively minimizing the overall contact of the reticle 30 with the container 10. In an alternate embodiment illustrated in FIG. 7A, dome shaped protrusion is sized to separate reticle 30 from support frame upper surface 145 to create a diffusion layer 210 that restricts fluid flow over the patterned surface 50 to prevent particulates from being transported to the patterned surface 50.

Still referring to FIGS. 2, 3, 5, 6, 10A, 10B, 10C and 10D, the reticle retainer structure comprises a plurality of reticle retainer posts 230 and a reticle retainer frame 235 (alternatively identified as a upper tray or upper portion of a secondary pod). Resilient couplings formed preferably of elastomeric material, preferably a thermoplastic elastomer, are configured as reticle retainer posts 230 and are mounted to or formed on cover 15 and configured to extend outwardly from the canopy concave inner surface 110 to terminate at retainer post ends 240. An exemplary embodiment of the reticle retainer frame 235 comprises a substantially square plate 240 with a retainer frame upper surface 245 and opposed retainer frame lower surface 250 extending between retainer frame corners 255 and retainer frame edges 260. Each of the retainer frame corners 255 is provided with a first retainer frame gusset 270 and a second retainer frame gusset 275 formed on the retainer frame lower surface 250 with the first and second retainer frame gussets 270 and 275 extending inwardly toward an retainer frame opposite corner 255 and inwardly toward an opposite retainer frame corner respectively. Reticle retainer posts 230 are attachable at retainer post ends 240 to retainer frame lower surface 250 proximate each of the corners 255. Each retainer frame corner 255, opposite the point of attachment of resilient retainer posts 230, is provided a dome shaped retainer protrusion 300 extending from retainer frame upper surface 245 proximate retainer frame corners 255. Upon engaging the cover 15 with the base 20, reticle support frame 135 and reticle retainer frame 235 engage each other to form a secondary pod 300 circumscribing a secondary enclosure 310 containing the reticle 30. In this configuration, dome shaped retainer protrusions 301 contact reticle upper surface 55 proximate corners 85 to secure the reticle 30 against movement relative to the secondary pod 300. Centering fins 302 or guide gussets can help center the reticle or aid in correct positioning of the upper portion on the lower portion. The reticle 30 is supported in a plane substantially normal to the lateral surface 60 on spaced apart reticle support pad 180 after self-centering itself on beveled concavity sidewalls 190 and 195 with the patterned surface 50 resting on dome shaped protrusions 200 and with the dome shaped retainer protrusions 300 bearing down on the chucking surface 55. Both, the reticle support posts 130 and the reticle retainer posts 230 are adapted to have low stiffness in an axial (z-direction) and lateral, i.e. in the x- and/or y-direction, so as to deform and deflect in response to any shock and vibration loading in those directions. Reticle retainer posts 230 are adapted to cooperate with reticle support posts 130, dome shaped protrusion 200 and dome shaped retainer protrusion 300 so that when cover 15 is mated with base 20, the reticle retainer posts 230 and reticle support posts 130 deform in the z-direction to maintain a continuous bias on surfaces 50 and 55 of reticle 30 with the dome shaped protrusions 200 and 300 applying local pressure sufficient to retain the reticle 30 in a desired, fixed reference position sandwiched between the reticle support structure 32 and the reticle retainer structure 34 during storage and transport. The domed shaped protrusions 200 and dome shaped retainer protrusions 300 may be formed of an elastomeric material to provide a high friction cushioning engagement with the surfaces 50 and 55 of reticle 30. One of skill in the art will appreciate that the arrangement of reticle support posts 130 and reticle retainer posts 230 will reduce the effect of vibration of the mounting base 20, i.e. the door and/or the cover 15, on the reticle 30 as will be clear from the schematic illustrations in FIGS. 11 and 12.

Referring to FIGS. 1, 2, 3 and 12, the resilient couplings 130 and 230 effectively suspend the secondary pod 300 within the primary pod 10, that is, the secondary pod is structurally connected to the primary pod entirely or exclusively through the elastomeric material comprising the resilient couplings. Said resilient couplings may be tubular shaped with axial bores 231 for easy assembly onto posts 232 on the upper portion, posts one the lower portion 233 of the secondary pod as well as posts 236 on the cover and posts 237 on the base of the primary pod.

Figure 7A:
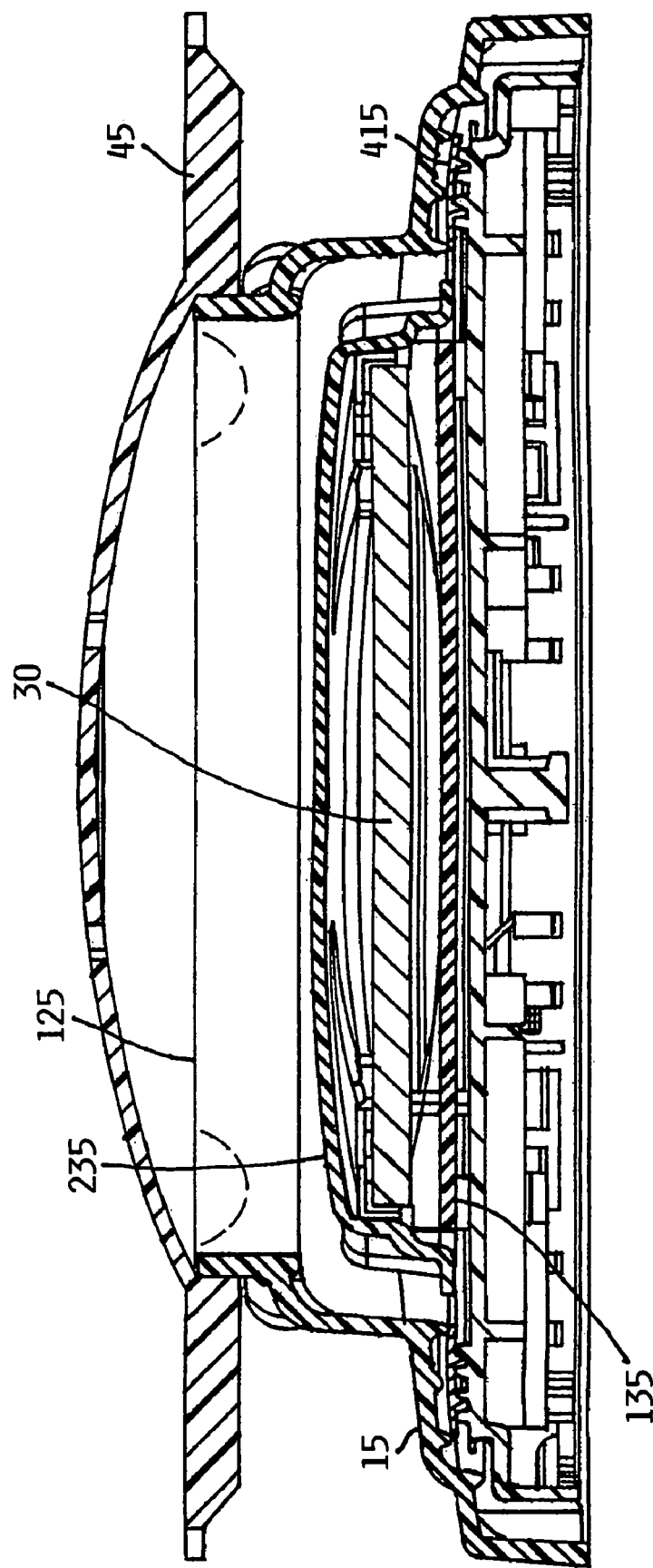
FIG. 7A is a cross-sectional side view of an assembled container according to an alternate embodiment of the present invention.
Figure 7B:
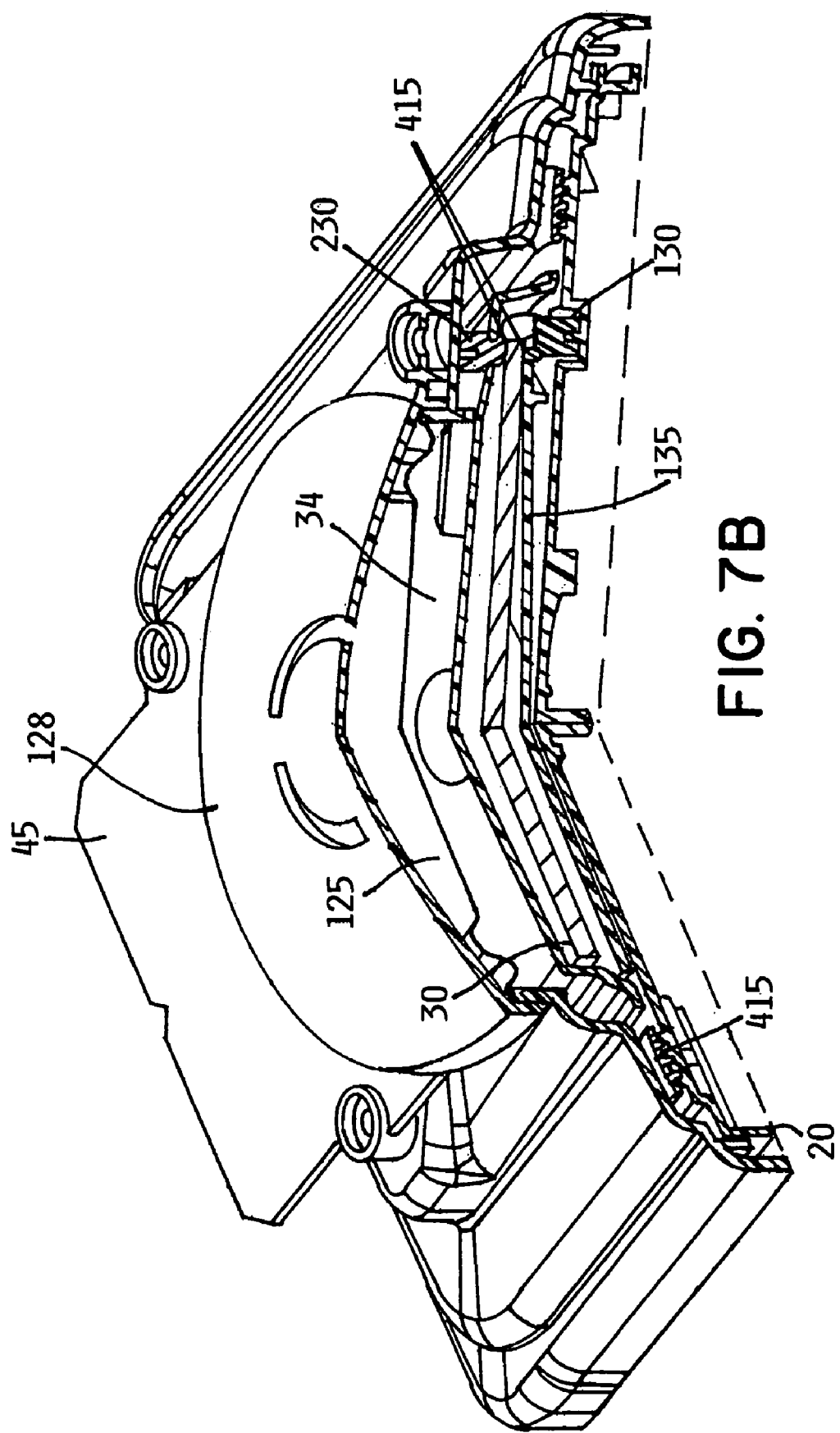
FIG. 7B is a perspective sectional view of an assembled container according to an embodiment of the present invention.
Figure 11:
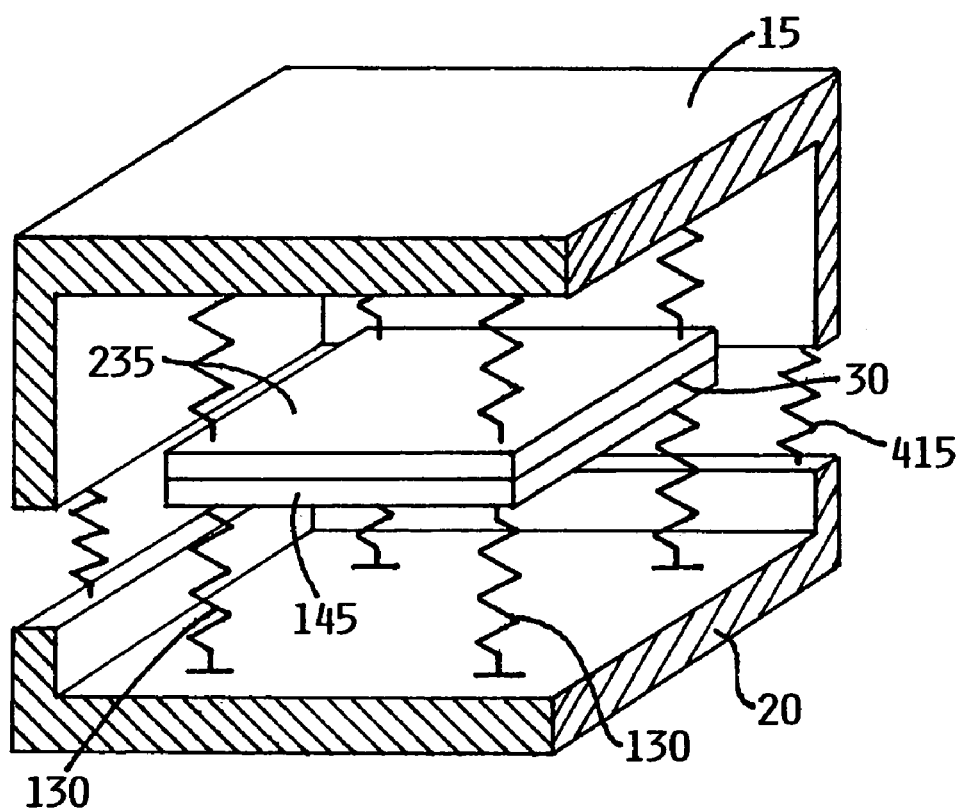
FIG. 11 is a schematic illustrating an exemplary shock and vibration isolation system according to the present invention.
Figure 12:
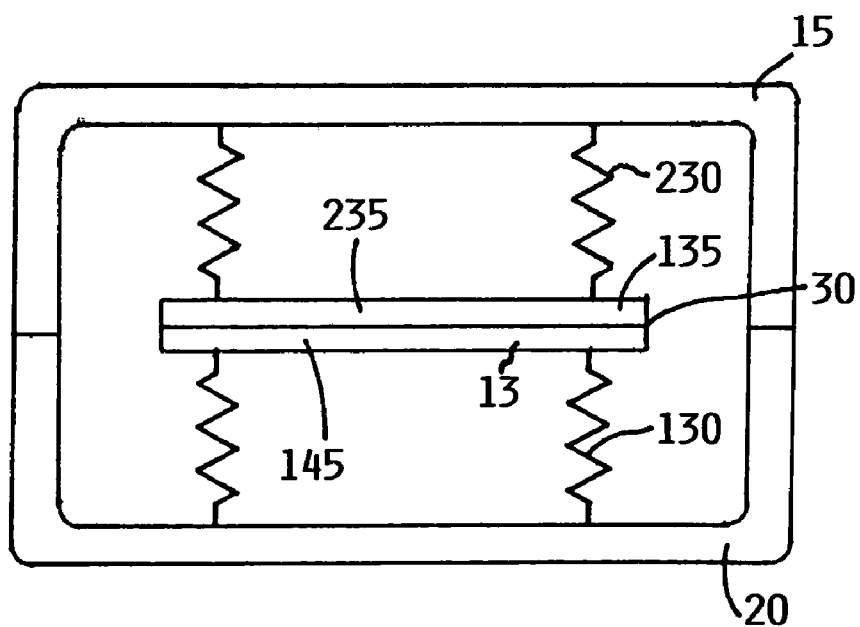
FIG. 12 is a schematic illustrating a shock and vibration isolation system according to the primary embodiment of the present invention.

FIGS. 11 and 12 are an idealized schematic representation of the primary pod 10 supporting the secondary pod 300 containing the reticle 30. As can be seen in the illustrations of FIGS. 11 and 12, reticle support posts 130 and reticle retainer posts 230 behave like spring-damper vibration isolation elements that allow the secondary 300 (and the reticle 30 contained therein) to be supported within the primary pod 10 with six degrees of freedom of motion. One of skill in the art will readily recognize that the arrangement of FIGS. 11 and 12 will substantially attenuate transmission of any shock and vibration loading of the primary pod 10 to the secondary pod 300. Reticle support frame 130 and reticle retainer frame 230 may be formed of a substantially rigid, electrostatically dissipative, non-particulating material such as for example carbon fiber-filled polyetheretherkeytone ("PEEK"). When the reticle container 10 encounters vibration or shock loading tending to deflect the resilient support posts 130 and the resilient retainer posts 230, the rigid reticle support frame 135 and reticle retainer frame 235 move as a substantially rigid body acting to constrain the deflections of the support posts 130 and retainer posts 230 and providing mass damping so that the reticle 30 is always maintained in the desired configuration within the container 10. In an alternate embodiment, reticle retainer frame 235 mates with reticle support frame 135 to form a secondary enclosure 310 (shroud of protection) within primary hermetically sealed enclosure 25 as best illustrated in FIGS. 1 and 7A. Secondary enclosure 310 is in fluid communication with hermetically sealed enclosure 25 but the air contained within the secondary enclosure 310 is relatively less susceptible to turbulence because of the smaller volume of air involved and the tortuous fluid flow path between the primary enclosure 25 and the secondary enclosure 310 created by the shroud of protection.

Another feature of the isolation system of the present invention is best described with reference to FIGS. 7A, 7B, 8A, 8B, 9A and 9B. Base upper surface 40 is provided with a structure defining a plurality of concentric ridges 400 that each define a peak 405 and a valley 410 extending in a loop on base upper surface 40 circumjacent base lateral surface 42 and radially outboard of the secondary pod 300. An elastomeric seal 415 is provided configured in a loop. The elastomeric seal 415 comprises opposed first and second seal major surfaces 420 and 425 extending laterally between inner and outer peripheral edges 430 and 435 of the seal and forming a continuous loop. The second major seal surface 420 is configured with a plurality of concentric, spaced apart wedges 440 (alternately referenced as "fingers", protrusions, projections, tongue shaped projections) extending outwardly from the second major seal surface 425, the wedges 440 are sized to be snug-fittingly received and held within consecutive valleys 410 of the concentric ridges 400 on base upper surface 40. Lateral portion 445 and 450 on each side of the concentric ridges 400 cantilever over the upper base surface 40. The cover engagement surface 100 is provided with a plurality ribs 455 complementary to the valleys 410 and dimensioned to bear down upon the first major seal surface 420 of the elastomeric seal 415 and substantially proximate the wedges 440 so as to compress the wedges 440 into sealing contact within the valleys 410 upon mating the cover 15 with the base 20 to form the hermetically sealed enclosure 25.

Figure 9A:
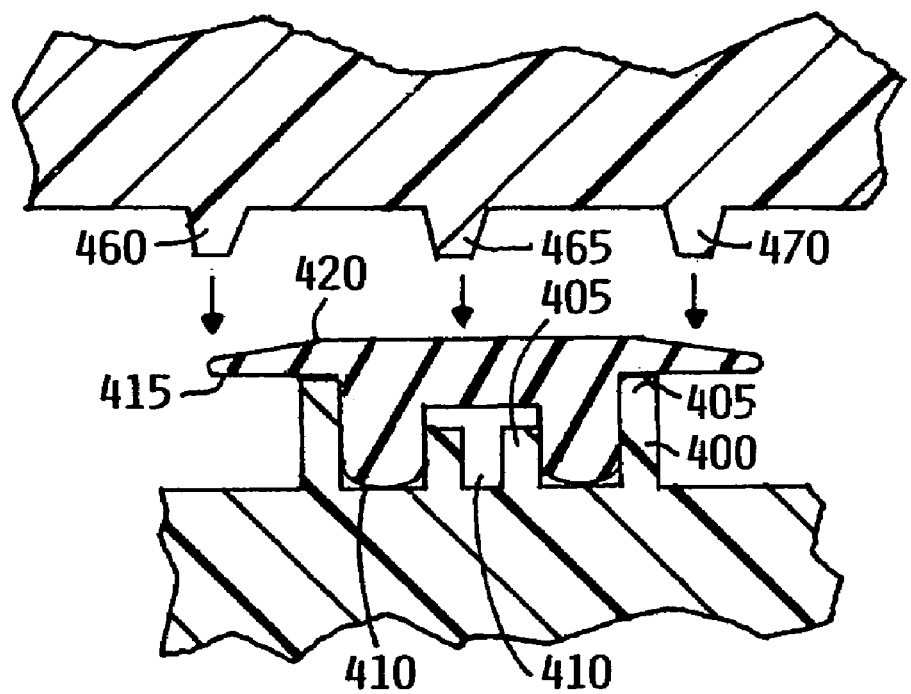
FIG. 9A is an illustration of an exemplary seal in an undeformed configuration according to the present invention.
Figure 9B:
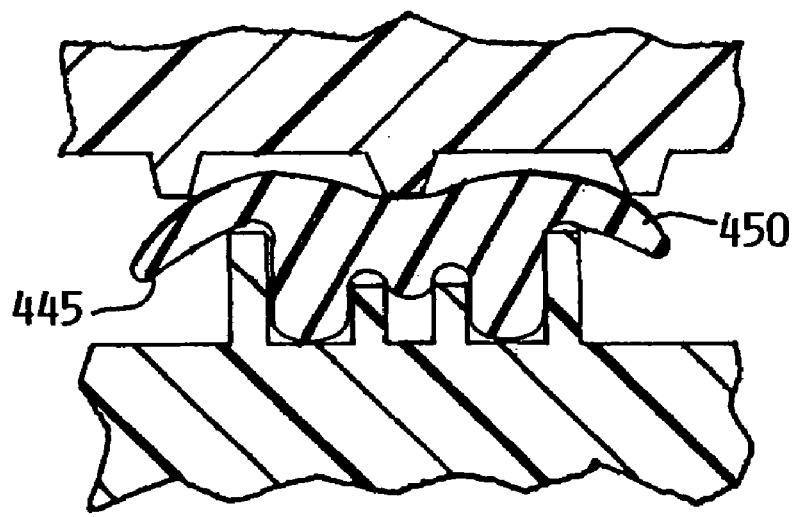
FIG. 9B is an illustration of a deformed configuration of the exemplary seal of FIG. 9A.

In an exemplary embodiment shown in FIGS. 9A and 9B, the elastomeric seal 415 deforms to take a shape substantially like the Greek letter Π. In the undeformed state, the horizontal bar of the Π is arched like an inverted "C". The vertical "legs" of the Π shaped seal 415 are the wedges 440 received within valleys 410. In the illustrated embodiment of FIGS. 9A and 9B, two concentric loops of wedges 415 are provided. The cover 20 has three concentric loops of ribs 460, 465 and 470 spaced apart so that the central rib 465 contacts the first major seal surface 415 substantially between the two concentric loops of wedges 415 and the outer ribs 460 and 470 wipe the lateral portions 445 and 450 of the elastomeric seal 415. This arrangement keeps elastomeric seal 415 in contact with both the cover 15 and base 20 while mated together. However, when the base 20 is retrieved, the seal 415 "springs" back from contact with the base upper surface 40 thereby avoiding particulate formation that would occur if the seal stuck to base and had to be peeled off by the action of the base manipulator.

Figure 8A:
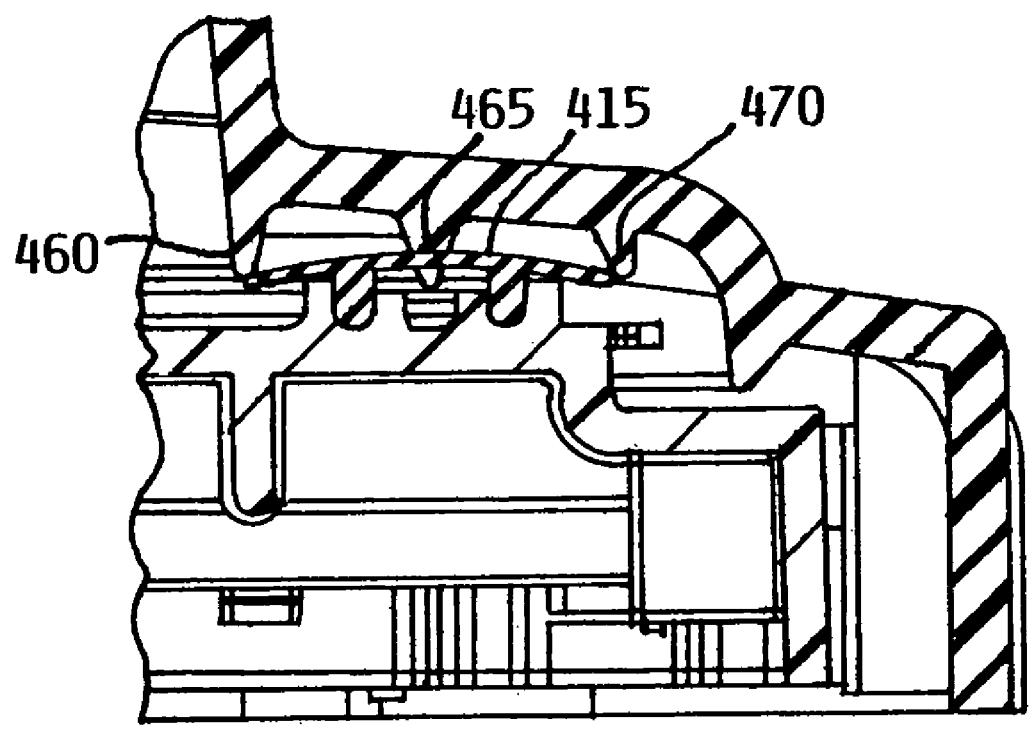
FIG. 8A is a detailed cross-sectional view illustrating an engagement between the cover and the base according to an alternate embodiment of the present invention.
Figure 8B:
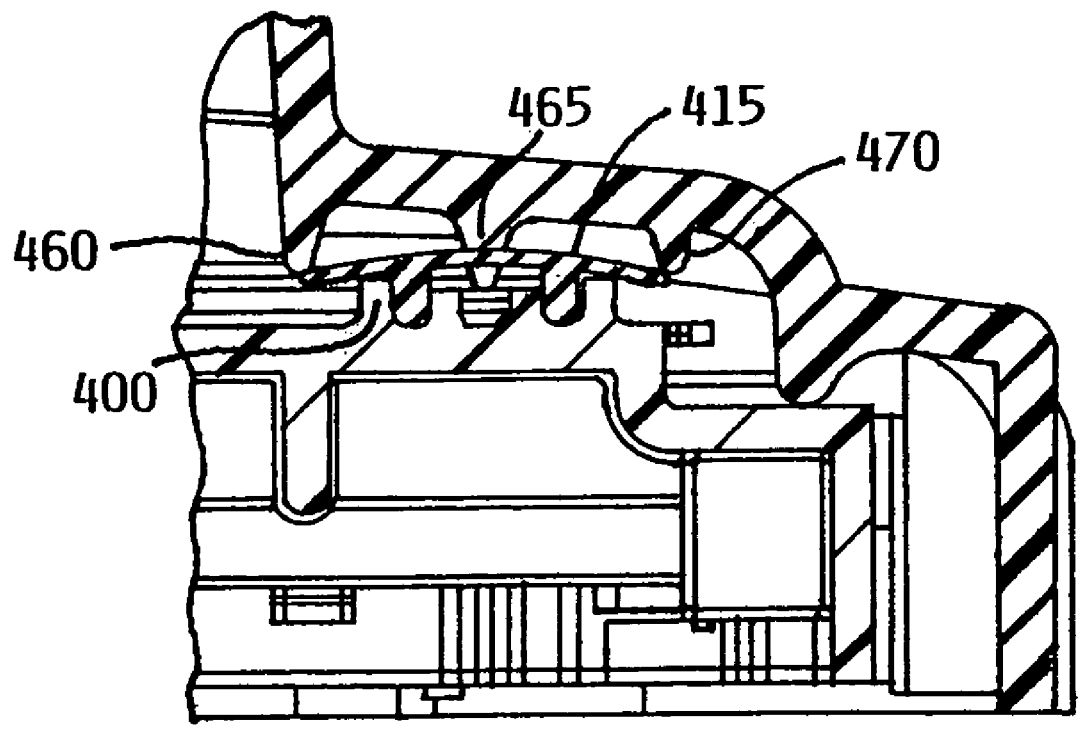
FIG. 8B is a detailed cross-sectional view illustrating an engagement between the cover and the base showing the cover contacting the base according to the primary embodiment of the present invention.

The elastomeric seal 415 may be a solid or hollow member having a shape such as illustrated in FIGS. 8A and 8B. It may be made of a non-sticky material such as silicone rubber, vinyl chloride resin or other suitable synthetic resin known in the art. In an exemplary embodiment illustrated in FIG. 11, the elastomeric seal 415 acts as a spring-damper in conjunction with the reticle support posts 130 and reticle retainer posts 230 to prevent shock and vibration loads on the primary pod 10 from being transmitted to the reticle 30.

The above configuration is particularly suitable for utilization of smaller reticles by simply replacing the secondary pod with a pod with inwardly set corner posts 461 as illustrated in FIG. 10A. The entirety of the primary pod with the isolation features can still be utilized.

Another embodiment of the container 10 provides for a path to ground for electrostatic dissipation from the patterned surface 50 and the chucking surface 55 of the reticle 30 through the reticle support structure 32 and the reticle retaining structure 34 as well as cover 15 and base 20. The reticle 30 is thereby protected from ESD. The method and apparatus is discussed in U.S. Pat. No. 6,513,654 to Asyst Technologies Inc., the contents of which are incorporated herein by reference.

What is claimed is:

1. Apparatus for supporting a substrate to provide shock and vibration isolation, the apparatus comprising:
   a primary pod including a cover configured with a concave inner surface and a base, the cover adapted to removably engage the base to define a first sealed enclosure between the concave surface and the base, the base having an interior with a latch mechanism contained therein;
   a secondary pod comprising a lower portion and an upper portion, the upper portion adapted to engage the lower portion to define a second enclosure for containing the substrate, the lower portion comprising support structure to hold the substrate thereupon and the upper portion comprising retaining structure for retaining the substrate when the upper portion is engaged with the lower portion;
   a plurality of resilient couplings extending upwardly from the base of the primary pod to the lower portion of the secondary pod and an additional plurality of resilient couplings extending downwardly from the cover to the upper portion providing a primary position of the secondary pod, including both the lower portion and the upper portion, with respect to the primary pod, the secondary pod, including both the lower portion and the upper portion, returnably moveable from the primary position by shock or vibrations, the plurality of resilient couplings extending upwardly from the base providing resilient support of the lower portion and the additional plurality of resilient couplings extending downwardly from the cover providing resilient support of the upper portion, the plurality of resilient couplings and the additional plurality of resilient couplings exclusively supporting the secondary pod, including both the lower portion and the upper portion and providing a plurality of degrees of freedom of movement to the secondary pod, including both the lower portion and the upper portion with respect to the primary pod.

2. The apparatus of claim 1 wherein the resilient coupling provides six degrees of freedom of movement in the displacement of the secondary pod, including the lower portion and the upper portion from its primary position.

3. The apparatus of claim 1 further comprising a plurality of resilient posts extending between the primary pod and the secondary pod.

4. The apparatus of claim 2 wherein the secondary pod has four corners and the plurality of resilient couplings extend vertically between the secondary pod and the primary pod at each of the four corners.

5. The apparatus of claim 4, wherein each of the resilient couplings has a first end and a second end and has openings at each of said ends and wherein each of the resilient couplings connect to both the primary pod and secondary pod by way of a plurality of projections extending from said primary and secondary pods, the projections received in the openings at said ends.

6. The apparatus of claim 1 wherein the lower portion of the secondary pod has a substantially square profile with four corners and has a four sides extending between the corners, each side having an arcuate shape presenting a concavity to the reticle when said reticle is supported in the lower portion.

7. The apparatus of claim 1 wherein the lower portion of the secondary pod has a top side and a bottom side, said lower portion has a substantially square profile with four corners with each of the corners having a gusset formed on the bottom side extending inwardly toward an opposite corner.

8. The apparatus of claim 6 wherein the lower portion of the secondary pod has a top side and a bottom side, said lower portion has a substantially square profile with four corners with each of the corners having a gusset formed on the bottom side extending inwardly toward an opposite corner.

9. The apparatus of claim 7 wherein the upper portion of the secondary pod has a top side and a bottom side, said upper portion having a substantially square profile with four corners with each of the corners having a radially extending gusset on the top side of said upper portion.

10. The apparatus of claim 9 wherein each gusset of the upper portion has a raised central portion with a pair of side walls that extend downwardly from the raised portion, and each gusset of the lower portion has a lowered portion extending downwardly with a pair of sidewalls.

11. The apparatus of claim 1 wherein the base of the primary pod has an upwardly facing surface with an outer edge, the upwardly facing surface having a groove therein extending along the edge portion, the apparatus further comprising an elastomeric seal configured in a loop positioned in the groove, and wherein the cover has an engagement projection for engaging with the elastomeric seal wherein said seal and said engagement projection provide a continuous engagement providing a sealing engagement between the cover and base.

12. The apparatus of claim 11 wherein the seal is compressed between the cover and base and wherein the cover is latched to the base the cover moveable vertically on the base a distance of at least 0.10 inches.

13. The apparatus of claim 1 wherein the base portion comprises four corner guides.

14. Apparatus for supporting a substrate to provide shock and vibration isolation, the apparatus comprising:
- a pod including a cover and a base, the cover configured with a concave inner surface and adapted to removably engage the base to define a sealed enclosure between the concave surface and the base, the base having an interior with a latch mechanism contained therein, the base further having an upwardly facing surface with an outer edge portion and having a groove therein extending along the outer edge portion, the apparatus further comprising an elastomeric seal configured in a loop positioned in the groove, and
- wherein the seal has a top surface with two cantilevered portions and a middle portion, and wherein the top cover has an outer periphery with three engagement ribs extending around the outer periphery, and wherein the three engagement ribs engage the two cantilevered portions and the middle portion providing a continuous engagement providing a sealing engagement between the cover and base.

15. Container for supporting a reticle to provide shock and vibration isolation, the container comprising:
- a primary pod including a cover and a door latchable to the cover,
- a secondary pod comprising a lower portion and an upper portion, the upper portion adapted to engage the lower portion to define a second enclosure for containing the reticle, the lower portion comprising support structure to hold a substrate thereupon and the upper portion comprising retaining structure for retaining the substrate when the upper portion is engaged with the lower portion;
- a plurality of resilient couplings extending upwardly from the door of the primary pod to the lower portion of the secondary pod and an additional plurality of resilient couplings extending downwardly from the cover of the primary pod to the upper portion of the secondary pod, whereby the plurality of resilient couplings extending upwardly and the additional plurality extending downwardly provide exclusive resilient support of the secondary pod, including the lower portion and the upper portion.

16. The container of claim 15 wherein the secondary pod has four corners and the plurality of resilient couplings extend vertically between the secondary pod and the primary pod at each of the four corners.

17. The container of claim 15, wherein each of the resilient couplings has a first end and a second end and has openings at each of said ends and wherein each of the resilient couplings connect to both the primary pod and secondary pod by way of a plurality of projections extending from said primary and secondary pods, the projections received in the openings at said ends.

18. The container of claim 15 wherein the lower portion of the secondary pod has a substantially square profile with four corners and has a four sides extending between the corners, each side having an arcuate shape presenting a concavity to the reticle when said reticle is supported in the lower portion.

19. The container of claim 15 wherein the upper portion and lower portion of the secondary pod have a gap extending from exterior of the secondary pod to interior of the secondary pod.

20. The container of claim 15 wherein the resilient couplings are formed from a thermoplastic elastomer.

* * * * *

UNITED STATES PATENT AND TRADEMARK OFFICE
CERTIFICATE OF CORRECTION

PATENT NO. : 7,607,543 B2
APPLICATION NO. : 11/364562
DATED : October 27, 2009
INVENTOR(S) : Gregerson et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 295 days.

Signed and Sealed this

Twelfth Day of October, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,607,543 B2 | Page 1 of 1 |
| APPLICATION NO. | : 11/364562 | |
| DATED | : October 27, 2009 | |
| INVENTOR(S) | : Barry Gregerson et al. | |

It is certified that error appears in the above-identified patent and that said Letters Patent is hereby corrected as shown below:

Col. 5, line 9, delete "with" and insert --which--

Col. 10, line 26, delete "one" and insert --on--

Signed and Sealed this
First Day of February, 2011

David J. Kappos
*Director of the United States Patent and Trademark Office*